(12) United States Patent
Clark

(10) Patent No.: US 12,446,470 B2
(45) Date of Patent: Oct. 14, 2025

(54) TECHNOLOGIES FOR MICROELECTROMECHANICAL SYSTEMS WITH COMPOSABLE PIEZOELECTRIC ACTUATORS

(71) Applicant: AUBURN UNIVERSITY, Auburn, AL (US)

(72) Inventor: Jason V. Clark, Auburn, AL (US)

(73) Assignee: AUBURN UNIVERSITY, Auburn, AL (US)

( * ) Notice: Subject to any disclaimer, the term of this patent is extended or adjusted under 35 U.S.C. 154(b) by 922 days.

(21) Appl. No.: 17/666,015

(22) Filed: Feb. 7, 2022

(65) Prior Publication Data

US 2022/0254982 A1 Aug. 11, 2022

Related U.S. Application Data

(60) Provisional application No. 63/146,802, filed on Feb. 8, 2021.

(51) Int. Cl.
| | |
|---|---|
| *H01L 41/04* | (2006.01) |
| *B81B 3/00* | (2006.01) |
| *H01L 41/047* | (2006.01) |
| *H10N 30/20* | (2023.01) |
| *H10N 30/857* | (2023.01) |

(52) U.S. Cl.
CPC ....... *H10N 30/2023* (2023.02); *B81B 3/0021* (2013.01); *B81B 3/0035* (2013.01); *H10N 30/857* (2023.02); *B81B 2201/03* (2013.01)

(58) Field of Classification Search
CPC ................................. H02N 2/18; H02N 2/181

USPC ................................. 310/328, 330–332, 800
See application file for complete search history.

(56) References Cited

U.S. PATENT DOCUMENTS

| | | | |
|---|---|---|---|
| 2005/0253487 A1* | 11/2005 | Allan | H10N 30/2044 310/331 |
| 2008/0061916 A1* | 3/2008 | Pulskamp | H01F 21/06 310/330 |
| 2012/0007477 A1* | 1/2012 | Takahashi | H10N 30/06 29/25.35 |

* cited by examiner

*Primary Examiner* — Derek J Rosenau
(74) *Attorney, Agent, or Firm* — Barnes & Thornburg LLP

(57) ABSTRACT

In at least one illustrative embodiment, a microelectromechanical system (MEMS) includes a composable piezoelectric actuator electrically coupled to a terminal. In response to a voltage applied across electrodes of the actuator, a piezoelectric rod moves from an initial position to a displaced position. In an embodiment, the MEMS includes two terminals, a resistive element is coupled between the terminals, and when in the displaced position the rod contacts one of the terminals. In an embodiment, the MEMS includes three terminals, and when a threshold voltage is applied to one of the terminals, the rod moves to the displaced position and allows current to flow between the other two terminals. In an embodiment, the MEMS includes a primary set of actuators that are mechanically but not electrically connected to a secondary set of actuators. An output terminal is coupled to the second set of actuators. Other embodiments are described and claimed.

13 Claims, 10 Drawing Sheets

TECHNOLOGIES FOR MICROELECTROMECHANICAL SYSTEMS WITH COMPOSABLE PIEZOELECTRIC ACTUATORS

CROSS-REFERENCE TO RELATED APPLICATIONS

The present application claims priority under 35 U.S.C. § 119(e) to U.S. Provisional Application Ser. No. 63/146,802, filed Feb. 8, 2021, the entire disclosure of which is hereby incorporated by reference.

BACKGROUND

Microelectromechanical systems (MEMS) are used in accelerometers, gyroscopes, digital displays, and many other systems. One important technology in MEMS systems is piezoelectric materials, allowing for movement in MEMS with a simple application of an electric field, without requiring gears, bearings, lubrication, etc. However, the relatively small change in dimension offered by piezoelectric materials limits the range of motion and has prevented large-scale movement based on piezoelectric actuators.

SUMMARY

According to one aspect, a microelectromechanical system (MEMS) includes a composable piezoelectric actuator and a first terminal. The composable piezoelectric actuator includes an elongated rod coupled to a first electrode and a second electrode, wherein the elongated rod is piezoelectric. The first electrode and the second electrode are configured such that in response to a voltage applied across the first electrode and the second electrode, an end of the actuator moves from an initial position to a displaced position. The first terminal is electrically coupled to the first electrode of the actuator. In some embodiments, the first and second electrodes are configured such that, when the voltage is applied across the first electrode and the second electrode, an electric field is generated between the second and first electrodes such that a first segment of the rod bends in a first direction and a second segment of the rod bends in a second direction approximately opposite the first direction.

In some embodiments, the elongated rod comprises a piezoelectric polymer. In some embodiments, the piezoelectric polymer comprises polyvinylidene fluoride (PVDF). In some embodiments, the first electrode and the second electrode are configured such that in response to a reverse voltage applied across the first electrode and the second electrode, the end of the actuator moves from the displaced position to the initial position.

In some embodiments, the system further includes a second terminal electrically coupled to the second electrode of the actuator; and a resistive element electrically coupled between the first terminal and the second terminal. In response to a voltage applied across the resistive element, the actuator moves from the initial position in which the end of the actuator is spaced apart from the second terminal to the displaced position in which the end of the actuator contacts the second terminal. When the actuator is in the displaced position the first terminal, the first electrode, and the second terminal are electrically connected.

In some embodiments, the system further includes a second terminal electrically coupled to the first electrode of the actuator, and a third terminal. In response to a voltage applied across the first terminal and the second electrode, the actuator moves from the initial position in which the end of the actuator is spaced apart from the third terminal to the displaced position in which the end of the actuator contacts the third terminal. When the actuator is in the displaced position, the second terminal, the first electrode, and the third terminal are electrically connected.

In some embodiments, the system further includes a power choking device coupled to the first terminal. In response to releasing power with the power choking device, the end of the actuator moves from the displaced position to the initial position.

According to another aspect, a microelectromechanical system (MEMS) includes a first anchor and a second anchor, wherein a first imaginary line extends through the first anchor and the second anchor. The system further includes a composable piezoelectric actuator comprising an elongated piezoelectric rod coupled to a first electrode and a second electrode, wherein the first electrode and the second electrode are configured such that in response to a voltage applied across the first electrode and the second electrode, an end of the actuator moves from an initial position to a displaced position. The system includes a second composable piezoelectric actuator comprising an elongated piezoelectric rod coupled to a first electrode and a second electrode, wherein the first electrode and the second electrode are configured such that in response to a voltage applied across the first electrode and the second electrode, an end of the second actuator moves from an initial position to a displaced position. The system further includes a first terminal electrically coupled to the first electrode of the actuator. The composable piezoelectric actuator is coupled to the first anchor and extends toward the second anchor, the second composable piezoelectric actuator is coupled to the second anchor and extends toward the first anchor, and the end of the composable piezoelectric actuator is coupled to the end of the second composable piezoelectric actuator. In the initial position the ends of the composable piezoelectric actuator and the second composable piezoelectric actuator are positioned on a first side of the first imaginary line, and in the displaced position the ends of the composable piezoelectric actuator and the second composable piezoelectric actuator are positioned on a second side of the first imaginary line. In some embodiments, the elongated rods of the first actuator and the second actuator have a combined length that is larger than a distance between the first anchor and the second anchor.

In some embodiments, the composable piezoelectric actuator and the second composable piezoelectric actuator comprise a first pair of actuators, and the system further includes a first electrical contact positioned between the first pair of actuators, and a second pair of actuators coupled between a third anchor and a fourth anchor, wherein a second electrical contact is positioned between the second pair of actuators, wherein the first electrode and the second electrode are configured such that in response to a voltage applied across the first electrode and the second electrode, an end of each actuator moves from an initial position to a displaced position. In an initial position, the second electrical contact is positioned on a first side of an imaginary line extending through the third anchor and the fourth anchor and in the displaced position the second electrical contact is positioned on a second side of the imaginary line extending through the third anchor and the fourth anchor. The system further includes a second terminal coupled to the first electrode of the second pair of actuators. When the second pair of actuators is in the displaced position, the second electrical contact contacts a third terminal. When the first pair of actuators is in the initial position, the first electrical contact does not contact the second electrical contact. When the first pair of actuators is in the displaced position and the second pair of actuators is in the initial position, the first electrical contact contacts the second electrical contact. When the first pair of actuators is in the displaced position and the second pair of actuators is in the displaced position, the first electrical contact does not contact the second electrical contact.

In some embodiments, the first terminal is coupled to a system input, the second terminal is coupled to a system output, and the third terminal is coupled to a system ground. In some embodiments, the first terminal is coupled to a logic high signal, the second terminal is coupled to a system output, and the third terminal is coupled to a logic low signal.

According to another aspect, a microelectromechanical system (MEMS) includes a first set of actuators, a second set of actuators, a first terminal electrically coupled to the first set of actuators, and a second terminal electrically coupled to the second set of actuators. Each actuator comprises a composable piezoelectric actuator including an elongated piezoelectric rod coupled to a first electrode and a second electrode, wherein the first electrode and the second electrode are configured such that in response to a voltage applied across the first electrode and the second electrode, an end of the actuator moves from an initial position to a displaced position. The first set of actuators extends from a first anchor to a second anchor, wherein the first anchor is fixed and the second anchor is free. The second set of actuators extends from a third anchor to the second anchor, wherein the third anchor is fixed. The first set of actuators is mechanically coupled to the second set of actuators at the second anchor, and the first set of actuators is electrically isolated from the second set of actuators.

In some embodiments, in response to a first voltage applied to the first terminal, the first set of actuators moves to the displaced position and urges the second set of the actuators to move to the displaced position. In response to movement to the displaced position, the second set of actuators generates a second voltage at the second terminal.

In some embodiments, the first set of actuators includes a first number of actuators, and the second set of actuators includes the first number of actuators. In some embodiments, the first set of actuators includes a first number of actuators, and the second set of actuators includes a second number of actuators greater than the first number.

In some embodiments, the end of each elongated rod of each actuator of the first set of actuators is coupled to the second anchor. In some embodiments, the end of each elongated rod of each actuator of the second set of actuators is coupled to the second anchor. In some embodiments, the system further includes an intermediate anchor, wherein the second set of actuators includes a first subset and a second subset; the end of each elongated rod of each actuator of the first subset is coupled to the intermediate anchor; and the elongated rod of each actuator of the second subset extends from the intermediate anchor to the second anchor.

According to another aspect, a microelectromechanical system (MEMS) comprises a composable piezoelectric actuator comprising an elongated piezoelectric rod coupled to a first electrode and a second electrode, wherein the first electrode and the second electrode are configured such that in response to a voltage applied across the first electrode and the second electrode, an end of the actuator moves from an initial position to a displaced position. The system further includes a first terminal electrically coupled to the first electrode of the actuator; a second terminal electrically coupled to the second electrode of the actuator; and a resistive element electrically coupled between the first terminal and the second terminal. When the actuator is in the initial position the end of the actuator is spaced apart from the second terminal, and when the actuator is in the displaced position the end of the actuator contacts the second terminal, and the first terminal, the first electrode, and the second terminal are electrically connected.

In some embodiments, the elongated rod comprises a piezoelectric polymer. In some embodiments, the piezoelectric polymer comprises polyvinylidene fluoride (PVDF). In some embodiments, the first electrode and the second electrode are configured such that in response to a reverse voltage applied across the first electrode and the second electrode, the end of the actuator moves from the displaced position to the initial position.

According to another aspect, a microelectromechanical system (MEMS) includes a composable piezoelectric actuator comprising an elongated piezoelectric rod coupled to a first electrode and a second electrode, wherein the first electrode and the second electrode are configured such that in response to a voltage applied across the first electrode and the second electrode, an end of the actuator moves from an initial position to a displaced position. The system further includes a first terminal electrically coupled to the first electrode of the actuator; a second terminal electrically coupled to the first electrode of the actuator; and a third terminal. When the actuator is in the initial position the end of the actuator is spaced apart from the third terminal, and when the actuator is in the displaced position the end of the actuator contacts the third terminal and the second terminal, the first electrode, and the third terminal are electrically connected. In some embodiments, the first electrode and the second electrode are configured such that in response to zero voltage applied across the first electrode and the second electrode, the end of the actuator moves from the displaced position to the initial position.

According to another aspect, a microelectromechanical system (MEMS) includes a plurality of actuators, each actuator comprising a composable piezoelectric actuator including an elongated piezoelectric rod coupled to a first electrode and a second electrode, wherein the first electrode and the second electrode are configured such that in response to a voltage applied across the first electrode and the second electrode, an end of the actuator moves from an initial position to a displaced position, and wherein the plurality of actuators extend from a first anchor; and a power choking device coupled to the plurality of actuators. In some embodiments, in response to a voltage applied to the plurality of actuators, the plurality of actuators extend to the displaced position; and in response to releasing power with the power choking device, the plurality of actuators retract to the initial position. In some embodiments, the power choking device comprises a switched capacitor or a mechanical escapement.

In some embodiments, a microelectromechanical system (MEMS) includes a first anchor and a second anchor, wherein a first imaginary line extends through the first anchor and the second anchor. The system further includes a first actuator coupled to the first anchor and a second actuator coupled to the second anchor, wherein each of the first actuator and the second actuator comprises a composable piezoelectric actuator including an elongated piezoelectric rod coupled to a first electrode and a second electrode, wherein the first electrode and the second electrode are configured such that in response to a voltage applied across the first electrode and the second electrode, an end of each actuator moves from an initial position to a displaced position. The system further includes a first electrical contact coupled to the end of the first actuator and the end of the second actuator and electrically connected to the first electrode of each of the first actuator and the second actuator. The system further includes a first terminal coupled to the first electrode of the first actuator and the second actuator. In the initial position the first electrical contact is positioned on a first side of the first imaginary line, and in the displaced position the first electrical contact is positioned on a second side of the first imaginary line. In some embodiments, the first electrode and the second electrode are configured such that in response to a reverse voltage applied across the first electrode and the second electrode, the end of each actuator moves from the displaced position to the initial position.

In some embodiments, the system further includes a third anchor and a fourth anchor, wherein a second imaginary line extends through the third anchor and the fourth anchor. The system further includes a third actuator coupled to the third anchor and a fourth actuator coupled to the fourth anchor, wherein each of the third actuator and the fourth actuator comprises a composable piezoelectric actuator including an elongated piezoelectric rod coupled to a first electrode and a second electrode, wherein the first electrode and the second electrode are configured such that in response to a voltage applied across the first electrode and the second electrode, an end of each actuator moves from an initial position to a displaced position. The system further includes a second electrical contact coupled to the end of the third actuator and the end of the fourth actuator and electrically connected to the first electrode of each of the third actuator and the fourth actuator. The system further includes a second terminal coupled to the first electrode of the third actuator and the fourth actuator. In the initial position the second electrical contact is positioned on a first side of the second imaginary line, and in the displaced position the second electrical contact is positioned on a second side of the second imaginary line and the second electrical contact contacts a third terminal. When the first electrical contact is in the initial position, the first electrical contact does not contact the second electrical contact. When the first electrical contact in the displaced position and the second electrical contact is in the initial position, the first electrical contact contacts the second electrical contact. When the first electrical contact is in the displaced position and the second electrical contact is in the displaced position, the first electrical contact does not contact the second electrical contact.

In some embodiments, the first terminal is coupled to a system input; the second terminal is coupled to a system output; and the third terminal is coupled to a system ground. In some embodiments, the first terminal is coupled to a logic high signal; the second terminal is coupled to a system output; and the third terminal is coupled to a logic low signal. In some embodiments, the elongated rods of the first actuator and the second actuator have a combined length that is larger than a distance between the first anchor and the second anchor.

According to another aspect, a microelectromechanical system (MEMS) includes a first pair of actuators extending from a first anchor, each actuator comprising a composable piezoelectric actuator including an elongated piezoelectric rod coupled to a first electrode and a second electrode, wherein when a voltage is applied across the first electrode and the second electrode, an end of the actuator moves from a first position to a second position. The system further includes a second pair of actuators extending from a second anchor and collinear with the first pair of actuators; a third pair of actuators extending from a third anchor and collinear with the first pair of actuators and the second pair actuators; a first rail coupled to the first pair of actuators and electrically isolated from the first pair of actuators, wherein the first rail extends toward the second pair of actuators; a second rail coupled to the second pair of actuators and electrically isolated from the second pair of actuators, wherein the second rail extends toward the first pair of actuators and the second pair of actuators; and a third rail coupled to the third pair of actuators and electrically isolated from the third pair of actuators, wherein the third rail extends toward the second pair of actuators. In response to a first voltage applied across the second pair of actuators, the second pair of actuators move to a first displaced position in which the second rail contacts the first rail. In response to a second voltage applied across the second pair of actuators the second pair of actuators move to a second displaced position in which the second rail contacts the third rail. In some embodiments, the second rail is coupled to a system output, and each of the first rail and the third rail is coupled to a logic high signal or a logic low signal. In some embodiments, the second pair of actuators is coupled to a pair of system inputs.

According to another aspect, a microelectromechanical system (MEMS) includes a first set of actuators and a second set of actuators. Each actuator comprises a composable piezoelectric actuator including an elongated piezoelectric rod coupled to a first electrode and a second electrode, wherein the first electrode and the second electrode are configured such that in response to a voltage applied across the first electrode and the second electrode, an end of the actuator moves from an initial position to a displaced position. The first set of actuators extends from a first anchor to a second anchor, wherein the first anchor is fixed and the second anchor is free. The second set of actuators extends from a third anchor to the second anchor, wherein the third anchor is fixed. The first set of actuators is mechanically coupled to the second set of actuators at the second anchor, and the first set of actuators is electrically isolated from the second set of actuators. The system further includes a first terminal electrically coupled to the first set of actuators, and a second terminal electrically coupled to the second set of actuators.

In some embodiments, in response to a first voltage applied to the first terminal, the first set of actuators moves to the displaced position and urges the second set of the actuators to move to the displaced position; and in response to movement to the displaced position, the second set of actuators generates a second voltage at the second terminal.

In some embodiments, the first set of actuators includes a first number of actuators, and the second set of actuators includes the first number of actuators. In some embodiments, the first set of actuators includes a first number of actuators, and the second set of actuators includes a second number of actuators greater than the first number.

In some embodiments, the end of each elongated rod of each actuator of the first set of actuators is coupled to the second anchor. In some embodiments, the end of each elongated rod of each actuator of the second set of actuators is coupled to the second anchor. In some embodiments, the system further includes an intermediate anchor. The second set of actuators includes a first subset and a second subset; the end of each elongated rod of each actuator of the first subset is coupled to the intermediate anchor; and the elongated rod of each actuator of the second subset extends from the intermediate anchor to the second anchor.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1A:
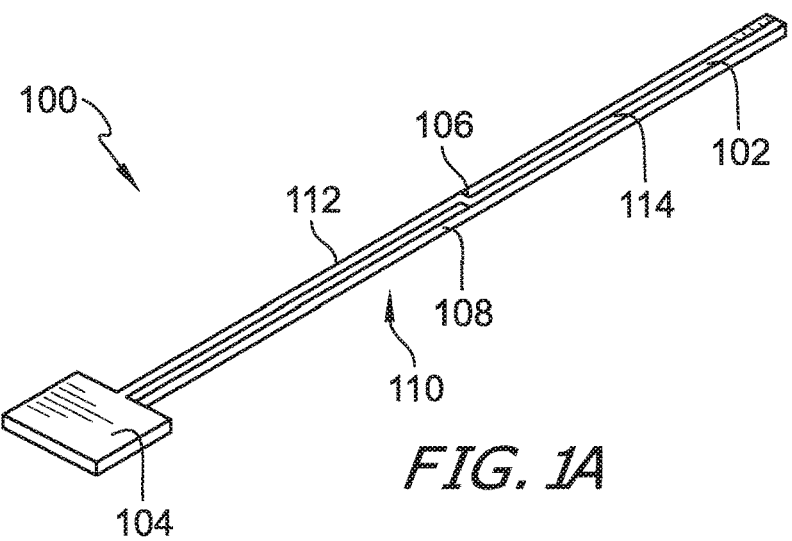
FIGS. 1A-1C are a simplified block diagram of at least one embodiment of a composable piezoelectric actuator.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features. It should be appreciated that, as used herein, terms such as "top," "bottom," "horizontal," "vertical," etc. may be used to describe relative positions of components but do not imply that a particular orientation of a device is required.

Figure 1B:
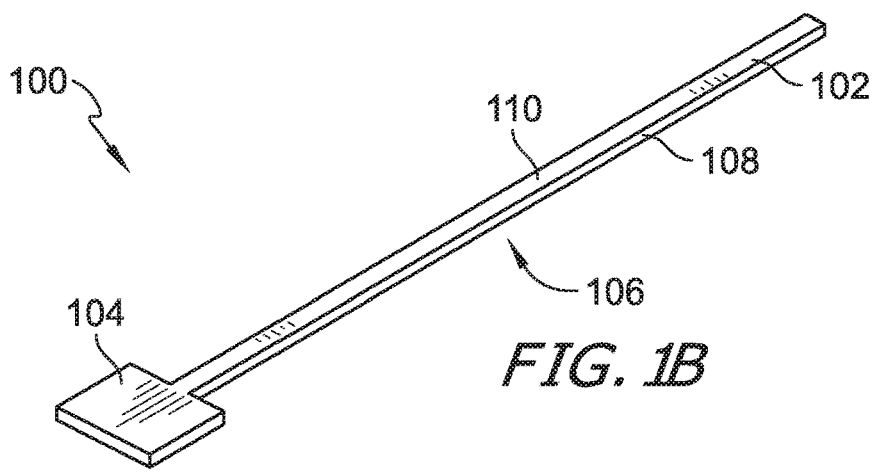
Figure 1C:
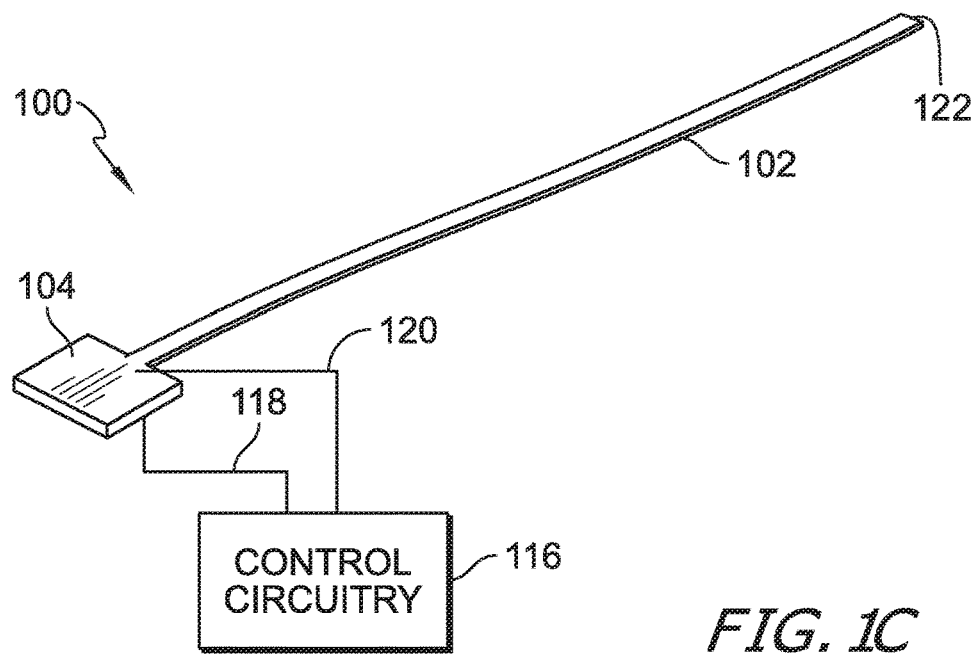

Referring now to FIGS. 1A-1C, an illustrative microelectromechanical system (MEMS) 100 includes a rod 102 connected to an anchor 104. The rod 102 includes a top electrode 106, an elongated rod 108, and a bottom electrode 110. In the illustrative embodiment, the top electrode 106 includes a first segment 112 and a second segment 114, as shown in FIG. 1A. The first segment 112 is a thin strip covering about half of the width of the elongated rod 108 and runs along one edge of the elongated rod 108. The second segment 114 is also a thin strip covering about half of the width of the elongated rod 108 and runs along a second edge of the elongated rod 108. The first segment 112 is connected to the second segment 114 in approximately the middle of the rod 102. The illustrative top electrode 106 covers the top surface of the anchor 104. The illustrative bottom electrode 110 extends approximately the entire bottom surface of the elongated rod 108 and the bottom surface of the anchor 104, as shown in FIG. 1B.

The elongated rod 108 is made of a piezoelectric material, so the physical dimensions of the rod 102 can change through the application of an electric field across the material. For example, the rod 102 may be polyvinylidene fluoride (PVDF), lead zirconate titanate (PZT), or any other suitable piezoelectric material. The material used in a particular embodiment may depend on, e.g., physical properties such as stiffness or density, ease of manufacture, biocompatibility, etc. For example, in some embodiments, the MEMS 100 may be integrated into an implanted device in a human body. In such embodiments, biocompatible PVDF may be preferred instead of the lead-containing PZT. In the illustrative embodiment, the anchor 104 is made of the same material as the elongated rod 108. Additionally or alternatively, the anchor 104 may be made up of a different material.

Referring now to FIG. 1C, control circuitry 116 may apply a voltage across the top electrode 106 and the bottom electrode 110, such as through a ground wire 118 connected to the bottom electrode 110 on the anchor 104 and a control wire 120 connected to the top electrode 106 on the anchor 104. (The top and bottom electrodes 106, 110 are not shown in FIG. 1C or the remaining figures in the interest of clarity.) When a voltage is applied across the top electrode 106 and the bottom electrode 110, an electric field is applied across the piezoelectric elongated rod 108. It should be appreciated that the electric field applied across the elongated rod 108 is not uniform. In particular, the first segment 112 of the top electrode 106 will apply a stronger electric field to the side of the elongated rod 108 covered by the first segment 112, creating a gradient in the electric field below the first segment 112. Similarly, the second segment 114 of the top electrode 106 will apply a stronger electric field to the other side of the elongated rod 108 that is covered by the second segment 112, creating a gradient in the electric field below the second segment 114 that mirrors the gradient below the first segment 112. As a result of the gradient in the electric field, the part of the elongated rod 108 that is directly below the first segment 112 of the electrode 106 will be extended in length through the piezoelectric effect relative to the adjacent part of the elongated rod 108 that is not directly below the first segment 112 of the electrode 106, causing the part of the rod 102 corresponding to the first segment 112 to bend in a first direction. The gradient of the electric field caused by the second segment 114 of the top electrode 106 produces a mirrored effect, causing the part of the rod 102 corresponding to the second segment 114 to bend in a direction opposite the first direction. As a result, a tip 122 of the rod is displaced as shown in FIG. 1C, without a significant rotation.

It should be appreciated that the displacement without significant rotation allows for several of the rods 102 to be joined together. For example, the top electrode 106 and bottom electrode 110 may be common among many arms 102, allowing for a single voltage to be applied to move several arms 102. As each arm 102 of an array of arms 102 is displaced the same amount without any significant rotation, the tops 122 of the arms 102 of the array can be joined together and connected to another array of arms 102, allowing for large-scale MEMS to be composed from smaller arrays of arms 102, as shown in more detail below in regard to FIGS. 2-9B. As the motion of the MEMS 100 is due to a deformation of the material itself, no lubrication is required.

The control circuitry 116 may be embodied as any suitable control circuitry 116. For example, in some embodiments, the control circuitry 116 may be a simple voltage source, such as a battery, with a switch. Additionally or alternatively, the control circuitry 116 may be embodied as more advanced circuitry, such as a microcontroller, a microprocessor, a field programmable gate array (FPGA), an application specific integrated circuit (ASIC), etc. It should be appreciated that the control circuitry 116 may be able to apply several different voltage levels, such as any voltage between 0-40 volts. In some embodiments, the control circuitry 116 may be connected through a wired or wireless connection to another device, and the control circuitry 116 may be able to send messages and/or power to and from the other device. Each of FIGS. 2-9B may include similar control circuitry as control circuitry 116, which is not depicted in the interest of clarity.

In the illustrative embodiment, the elongated rod 108 is 200 micrometers long, with a width of 4 micrometers and a height (i.e., distance between the top electrode 106 and the bottom electrode 110) of 2 micrometers. In other embodiments, the elongated rod 108 may have a length between 30 and 500 micrometers, and the height and/or width of the elongated rod 108 be between 0.1 and 100 micrometers. Each of the top electrode 106 and the bottom electrode 110 may be any suitable conductive material, such as gold, copper, aluminum, doped semiconductor, etc. The top electrode 106 and the bottom electrode 110 may be any suitable thickness, such as 0.05 micrometers. The dimensions of the elongated rod 108 may depend on the particular application being used. For example, if higher stiffness is required, an elongated rod 108 with a higher cross-section may be used. If higher deflection with a lower voltage is desired, a thinner elongated rod 108 may be used.

It should be appreciated that, in the illustrative embodiment, the change in length of the rod 102 due to the applied electric field is relatively small, such as 0.1%. However, the deflection caused by the applied electric field can be relatively large. For example, in the illustrative embodiment, a rod 102 with a length of 200 micrometers and a width of 4 micrometers can be displaced over 10 micrometers with an applied voltage of 34 volts, leading to a displacement that is over 2.5 times the width of the rod 102.

It should be appreciated that the specific configuration shown in FIG. 1A of the anchor 104, the elongated rod 108, and electrodes 106, 110 is just one possible configuration of the MEMS 100, and that the approach disclosed herein is compatible with many different configurations. For example, in some embodiments, the bottom electrode 110 may follow a meandering path similar to the top electrode 106, which may provide a stronger, more confined electric field across the elongated rod 108. In some embodiments, a width and/or height of the elongated rod 108 may change along the length of the elongated rod 108, leading to different mechanical properties and different amounts of curvature, which may be controlled with different length or shape electrodes. In some embodiments, the cross-section of the elongated rod 108 may not be uniform along its length, but the rod 108 may meander in a similar manner as the top electrode 106 shown in FIG. 1A. In some embodiments, the rod 108 may be manufactured to that it is curved while in a relaxed state (i.e., without an electric field applied), and the rod 108 may be straightened upon application of a voltage across the electrodes 106, 110. It should be appreciated that, in FIG. 1A, the piezoelectric material of the rod 108 has a particular crystal orientation and/or is poled in a direction such that the applied electric field causes the rod 108 to bend as shown. Additionally or alternatively, the piezoelectric rod 108 may have a different crystal orientation and/or poling direction such that it responds differently to an applied electric field, such as rotating in an orthogonal direction from that shown in FIG. 1C.

In use, and as described further below in connection with FIGS. 2-9B, one or more MEMS 100 may be used as composable piezoelectric actuators to form system components that perform various electronic circuit functions. For example, one or more MEMS 100 may be configured to perform operations similar to an operational amplifier (opamp), a bistable switch, a nonvolatile memory, a transistor, an energy storage device similar to a battery, a universal logic gate, a transformer, an inductor, and/or a diode. Such systems may include one or more MEMS 100 coupled to one electrical terminal, two electrical terminals, three electrical terminals, or otherwise configured to be included in an electrical circuit. Compared to traditional electronic components, such components including MEMS 100 may have advantages including increased robustness (e.g., dust resistance and other improved performance in harsh environments), biocompatibility (e.g., when formed from piezoelectric polymers), and ability to be manufactured using 3-D printing or other additive manufacturing.

Figure 2:
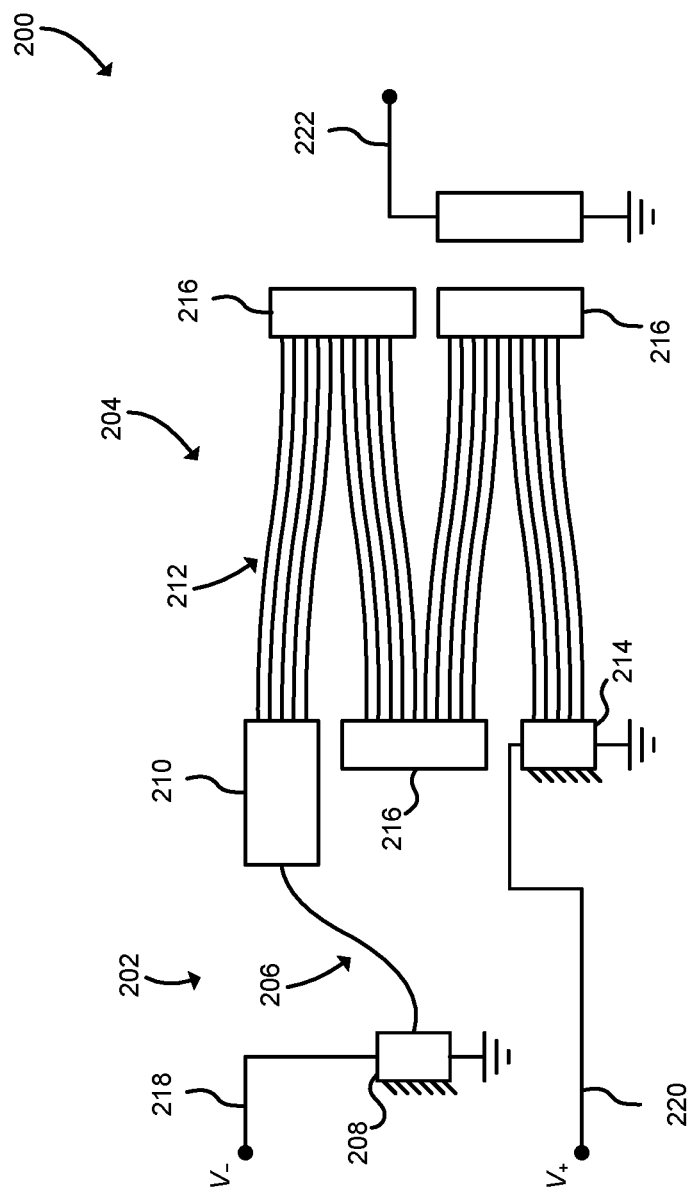
FIG. 2 is a simplified block diagram of at least one embodiment of an operational amplifier including several of the composable piezoelectric actuators of FIGS. 1A-1C.

Referring now to FIG. 2, a MEMS 200 includes a primary set of composable piezoelectric actuators 202 and a secondary set of composable piezoelectric actuators 204. Each of the actuators 202, 204 may be embodied as one or more actuators 100 as shown in FIGS. 1A-1C and as described above. As shown, the primary actuator 202 includes an elongated rod 206 that extends from an anchor 208 to an anchor 210. The anchor 208 is fixed in position, and the anchor 210 is free to move as an end of the rod 206 is displaced. Additionally or alternatively, although illustrated in FIG. 2 as including a single elongated rod 206, it should be understood that the primary actuator 202 may include a different number and/or arrangement of rods 206, which may be connected in series and/or in parallel.

Similarly, the secondary set of actuators 204 includes multiple elongated rods 212, which are illustratively bundles of five rods 212 that are connected in parallel. One bundle of rods 212 is connected to an anchor 214, which is fixed in position, and to an intermediate anchor 216, which is free to move. Additional bundles of rods 212 are connected between additional intermediate anchors 216 in series. A last bundle of rods 212 is connected to the anchor 210. At the anchor 210, the primary actuators 202 and the secondary actuators 204 are connected mechanically but not electrically. For example, the anchor 210 may be formed from a non-conductive piezoelectric polymer, and the respective electrodes 106, 110 of the primary actuators 202 and the secondary actuators 204 may not contact each other on the anchor 210.

The MEMS 200 further includes three electrical terminals 218, 220, and 222. As shown, the terminal 218 is coupled to the anchor 208, for example, to the electrode 106 of the primary actuators 202. Similarly, the terminal 220 is coupled to the anchor 214, for example to the electrode 106 of the secondary actuators 204. In that example, the electrodes 110 of each of the actuators 202, 204 may be coupled to ground. The terminal 222 may be coupled to a resistive load.

In use, the MEMS 200 may operate as an analog amplifier. A voltage applied to the terminal 218 may cause an electric field to be generated within the elongated rod 206 of the primary actuator 202, which causes the actuator 202 to displace the anchor 210. Because the anchor 210 is mechanically connected to the secondary actuators 204, displacement of the anchor 210 exerts force on the elongated rods 212 of the secondary actuator 214, causing mechanical stress and/or strain. This stress and/or strain creates an electric field across the elongated rods 212 due to the piezoelectric effect, and that electric field causes a corresponding voltage at the terminal 220. The ratio of the input voltage at the terminal 218 ($V_-$) to the output voltage at the terminal 220 ($V_+$) is shown below in Equation 1. The constant β, which is the amplifier gain, may depend on the number and/or arrangement of the primary actuators 202 and the secondary actuators 204. For example, the constant β may depend on the relative number of primary actuators 202 compared to the number of secondary actuators 204. As another example, the constant β may depend on the relative distance displaced by the actuators 202, 204, which may be adjusted by arranging the rods 206, 212 in series and/or in parallel. Further, because the primary actuators 202 and the secondary actuators 204 are not connected electrically, in use the amount of electrical current flowing between the terminals 218, 220 approaches zero (i.e., infinite input resistance). Accordingly, the MEMS 200 may behave similarly to an ideal electrical operational amplifier (opamp). Thus, in some embodiments the MEMS 200 may be used in electrical circuits where the behavior of an opamp is desired, such as amplifiers, filters, comparators, or other analog circuits.

$$V_+ = \beta V_- \qquad (1)$$

Figure 3A:
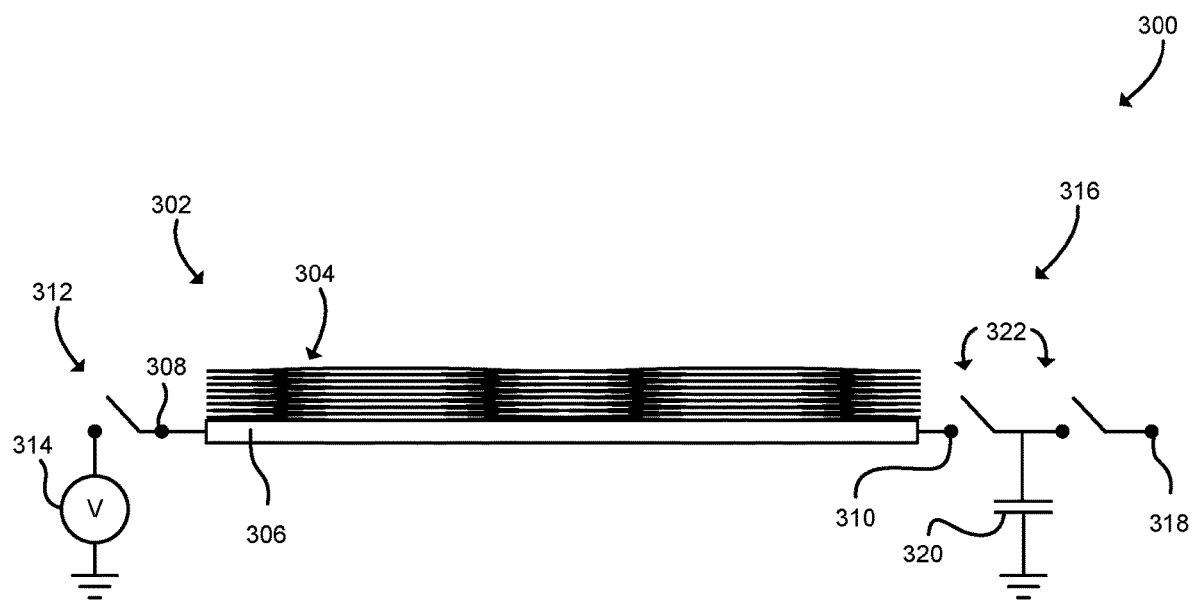
FIGS. 3A and 3B are simplified block diagrams of at least one embodiment of an energy storage device including several of the composable piezoelectric actuators of FIGS. 1A-1C FIGS. 4A-4C are simplified block diagrams of at least one embodiment of a bistable switch including several of the composable piezoelectric actuators of FIGS. 1A-1C.
Figure 3B:
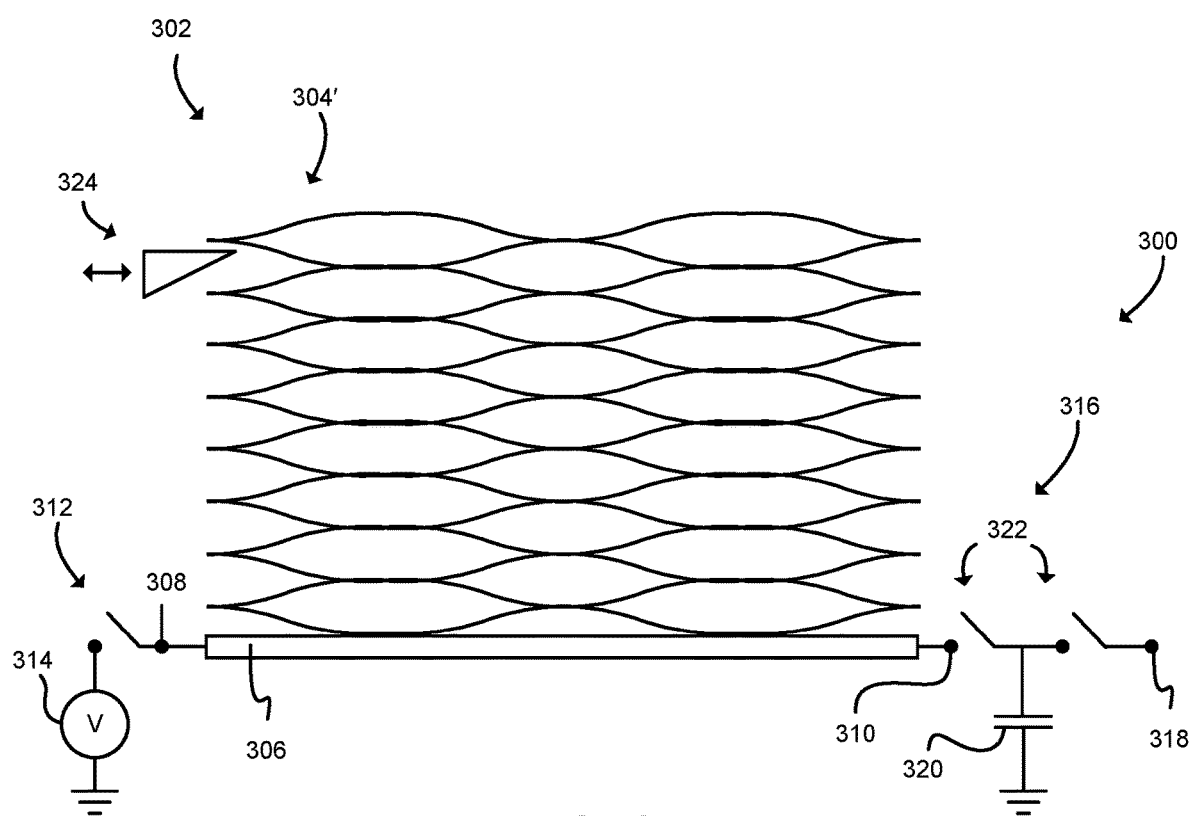

Referring now to FIGS. 3A and 3B, a MEMS 300 includes a set of composable piezoelectric actuators 302 having multiple elongated rods 304 coupled to an anchor 306. Each of the actuators 302 may be embodied as one or more actuators 100 as shown in FIGS. 1A-1C and as described above. The rods 304 of the actuators 302 are connected electrically, for example having a common electrode 106 and a common electrode 110. The actuators 302 are illustratively connected together both in parallel and in series; however, in other embodiments the MEMS 300 may include a different number and/or arrangement of actuators 302.

The MEMS 300 includes electrical terminals 308, 310 that are electrically connected to the actuator 302, for example to the common electrode 106 of the rods 304. The other common electrode 110 of the rods 304 may be connected to ground (not shown). The terminal 308 is illustratively connected to a switch 312, which selectively connects the terminal 308 to a voltage source 314. As described further below, the terminal 308 may be used to supply electrical energy to the MEMS 300.

The terminal 310 is coupled to a choking device 316, which is configured to allow the MEMS 300 to gradually release stored energy to an output terminal 318, which may be connected to a load (not shown). Illustratively, the choking device 316 includes a capacitor 320 and a pair of switches 322 which may be used to gradually release stored energy to the output terminal 318 as described further below. Additionally or alternatively, in some embodiments the choking device 316 may be embodied as a mechanical spring escapement or other device that regulates voltage and/or current released by the MEMS 300 at the output terminal 318.

In use, the MEMS 300 may operate as an energy storage device similar to a battery. Initially, as shown in FIG. 3A, the MEMS 300 is discharged, and the rods 304 of the actuators 302 are each in a relaxed, roughly straight shape. The switch 308 may be closed, allowing the voltage source 314 to apply a voltage to the actuators 302. In response to the applied voltage, the rods 304 are displaced. As shown in FIG. 3B, after voltage has been applied, the rods 304' are in a position in which the end of each rod is displaced from its original position. In some embodiments, the rods 304' may be mechanically latched or otherwise retained in the displaced position as shown in FIG. 3B. In the illustrative embodiment shown in FIG. 3B, a moveable latch 324 retains the rods 304' in the displaced position, although any appropriate retention mechanism may be used in other embodiments. In this position, mechanical stress and/or strain experienced by the rods 304' causes a voltage across the rods 304' due to the piezoelectric effect.

In order to release the energy stored in the MEMS 300, the switches 322 may be alternatively opened and closed, which causes the capacitor 320 to be alternatively connected to the rods 304' and then to the output terminal 318. When the rods 304' are electrically connected to the capacitor 320, the voltage created by the piezoelectric effect across the electrodes 106, 110 of the rods 304' causes energy to be transferred to the capacitor 320. When the capacitor 320 is connected to the output terminal 318, that energy may be transferred to a load. The MEMS 300 may continue to release energy until the rods 304' relax to their original shape, as shown in FIG. 3A.

Figure 4A:
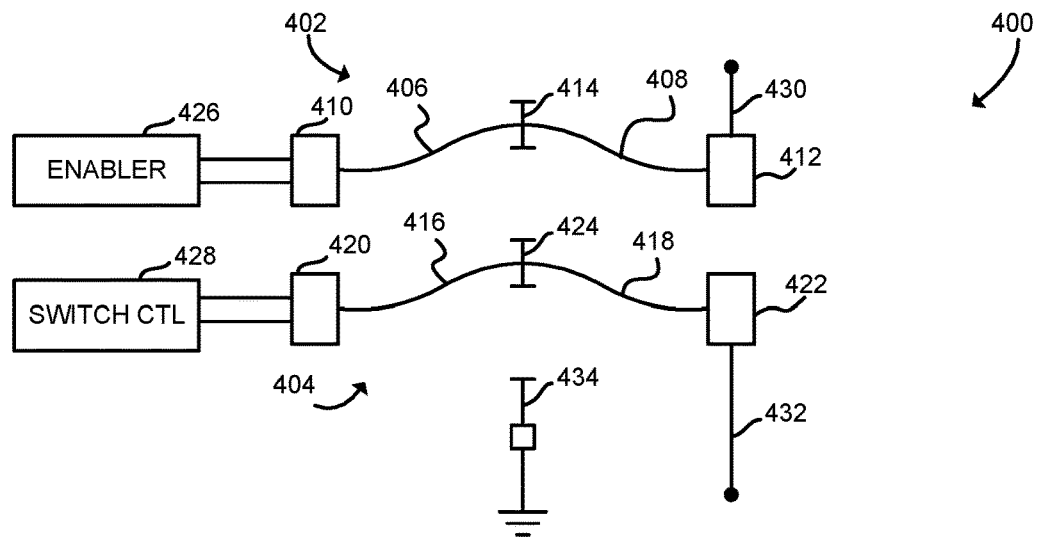
Figure 4B:
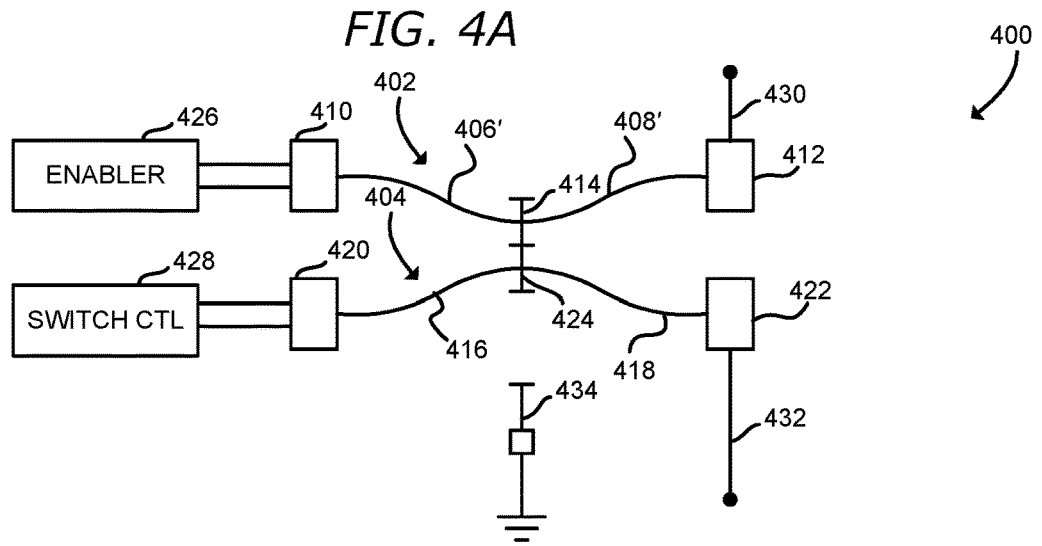
Figure 4C:
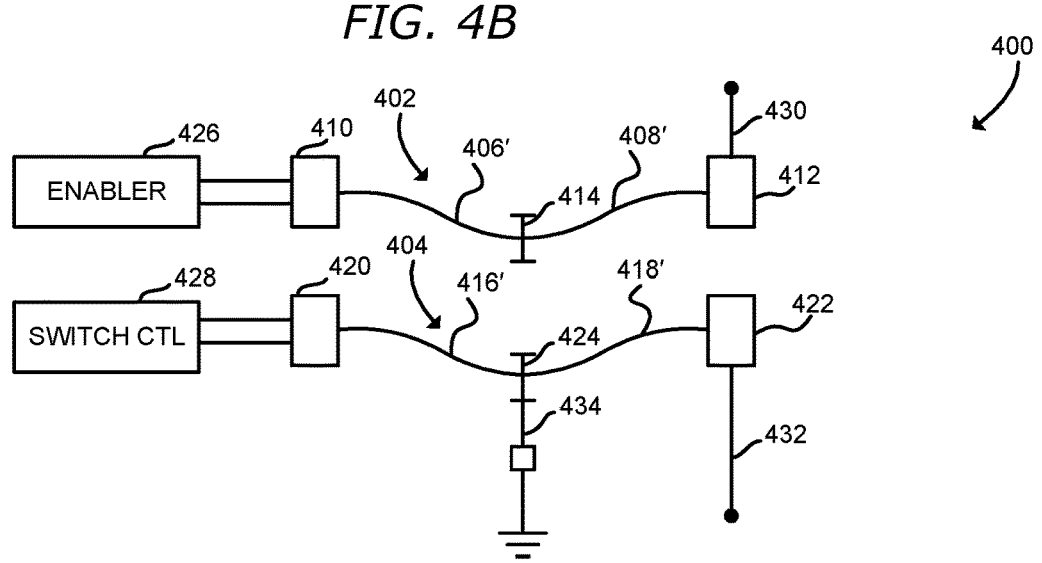

Referring now to FIGS. 4A-4C, a MEMS 400 includes two actuator assemblies 402, 404. Each of the actuator assemblies 402, 404 may be embodied as one or more composable piezoelectric actuators 100 as shown in FIGS. 1A-1C and as described above. As shown, the actuator assembly 402 includes a pair of elongated rods 406, 408 that extend between a pair of anchors 410, 412. In particular, the rod 406 extends from the anchor 410 toward the anchor 412, the rod 408 extends from the anchor 412 toward the anchor 410, and the rods 406, 408 are connected together at their respective ends. Each of the anchors 410, 412 is fixed in place, and an electrical contact 414 is positioned at the connection of the rods 406, 408. The electrical contact 414 is illustratively coupled to the electrode 106 of both of the rods 406, 408. Similarly, the electrodes 110 of the rods 406, 408 are electrically connected. As shown in FIG. 4A, each of the rods 406, 408 is manufactured with a curved shape such that when no electric field is applied to the rods 406, 408, the ends of the rods 406, 408 (and thus the electrical contact 414) are laterally displaced away from an imaginary line that extends straight through the anchors 410, 412. Accordingly, because the ends of the rods 406, 408 are displaced from the anchors 410, 412, the total length of the rods 406, 408 is slightly larger than the distance between the anchors 410, 412.

The actuator assembly 404 is similar to the actuator assembly 402 and includes elongated rods 416, 418 that extend between fixed anchors 420, 422 and an electrical contact 424 positioned at the connection of the rods 416, 418. The electrical contact 424 is illustratively coupled to the electrode 106 of both of the rods 416, 418. The rods 416, 418 are similarly manufactured with a curved shape such that when no electric field is applied to the rods 416, 418, the ends of the rods 416, 418 (and thus the electrical contact 424) are laterally displaced from an imaginary line that extends straight through the anchors 420, 422.

The actuator assembly 402 is coupled to enabler circuitry 426, which is configured to selectively apply a voltage across the electrodes 106, 110 of the actuator assembly 402. In particular, the various components of the actuator assembly 402 include a common electrode 106 and a common electrode 110, and the enabler circuitry 426 may be connected to the electrodes 106, 110 at the anchor 410. Similarly, the actuator assembly 404 is coupled to switch controller circuitry 428, which is configured to selectively apply a voltage across the electrodes 106, 110 of the actuator assembly 404. In particular, the various components of the actuator assembly 404 include a common electrode 106 and a common electrode 110, and the switch controller circuitry 428 may be connected to the electrodes 106, 110 at the anchor 410.

The MEMS 400 further includes an electrical terminal 430 that is coupled to the electrode 106 of the actuator assembly 402 at the anchor 412, and an electrical terminal 432 that is coupled to the electrode 106 of the actuator assembly 404 at the anchor 422. The MEMS 400 may also include a ground 434 as described further below.

In use, the MEMS 400 may operate as a bistable switch. Initially, as shown in FIG. 4A, the terminal 430 is electrically disconnected from the terminal 432, and no current may flow between the terminals 430, 432. After applying a voltage to the actuator assembly 402 using the enabler circuitry 426, the actuator assembly 402 displaces the contact 414 to a displaced position as shown in FIG. 4B. As shown in FIG. 4B, the displaced rods 406', 408' have a curved shape such that their ends (and thus the contact 414) are positioned laterally on the other side of the imaginary line extending through the anchors 410, 412. As described above, the combined length of the rods 406', 408' is greater than the distance between the anchors 410, 412. Accordingly, the rods 406', 408' are mechanically latched in the displaced position shown in FIG. 4B without the application of any additional voltage or current. The actuator assembly 402 may remain in the displaced position shown in FIG. 4B until the enabler circuitry 426 applies a reverse voltage to the actuator assembly 402, which causes the actuator 402 to move to the initial position shown in FIG. 4A.

In the displaced position shown in FIG. 4B, the contact 414 of the actuator assembly 402 touches the contact 424 of the actuator assembly 404. As described above, the contacts 414, 424 are electrically connected to the electrodes 106 of the respective actuator assemblies 402, 404. Thus, when the contacts 414, 424 are touching, the electrodes 106 of the actuator assemblies 402, 404 are electrically connected. Therefore, when the actuator assemblies 402, 404 are in the positions shown in FIG. 4B, electrical current may flow between the terminals 430, 432 via the electrodes 106 of the actuator assemblies 402, 404. This electrical current flowing through only one electrode 106 does not create an electrical field through the rods 406, 408 or the rods 416, 418 of the actuator assemblies 402, 404. Accordingly, the actuator assemblies 402, 404 may remain in the displaced position shown in FIG. 4B while conducting current through the terminals 430, 432. This displaced position may be considered an on state of a bistable switch.

After applying a voltage to the actuator 404 using the switch controller circuitry 428, the actuator 404 displaces the contact 424 to a displaced position as shown in FIG. 4C. As shown in FIG. 4C, the displaced rods 416', 418' have a curved shape such that their ends (and the contact 424) are positioned laterally on the other side of the imaginary line extending through the anchors 420, 422. As described above, the combined length of the rods 416', 418' is greater than the distance between the anchors 420, 422. Accordingly, the rods 416', 418' are mechanically latched in the displaced position shown in FIG. 4C even without application of any additional voltage or current. The actuator assembly 404 may remain in the displaced position shown in FIG. 4C until the switch control circuitry 428 applies a reverse voltage to the actuator assembly 404, which causes the actuator assembly 404 to move to the initial position shown in FIG. 4B.

In the displaced position shown in FIG. 4C, the contact 424 of the actuator 404 is disconnected from the contact 414 of the actuator 402 and instead touches the ground 434. Thus, in the position shown in FIG. 4C, the terminals 430, 432 are electrically disconnected and current cannot flow between them. Additionally, the terminal 432 is grounded. This displaced position may be considered an off state of the bistable switch. Additionally or alternatively, in some embodiments in the displaced position shown in FIG. 4C, the contact 424 may not contact the ground 434 or any other circuit element, and thus an open circuit may exist between the terminals 430, 432. The switch controller 428 may selectively apply voltage to the actuator 404 in order to cause the MEMS 400 to switch between the on state as shown in FIG. 4B (in which current may flow between the terminals 430, 432) and the off state as shown in FIG. 4C (in which no current may flow between the terminals 430, 432). Because the MEMS 400 does not require additional voltage or current in order to maintain the actuator assemblies 402, 404 in the on state or the off state, the MEMS 400 may provide improved efficiency and/or reduced power consumption compared to other switches.

Figure 5A:
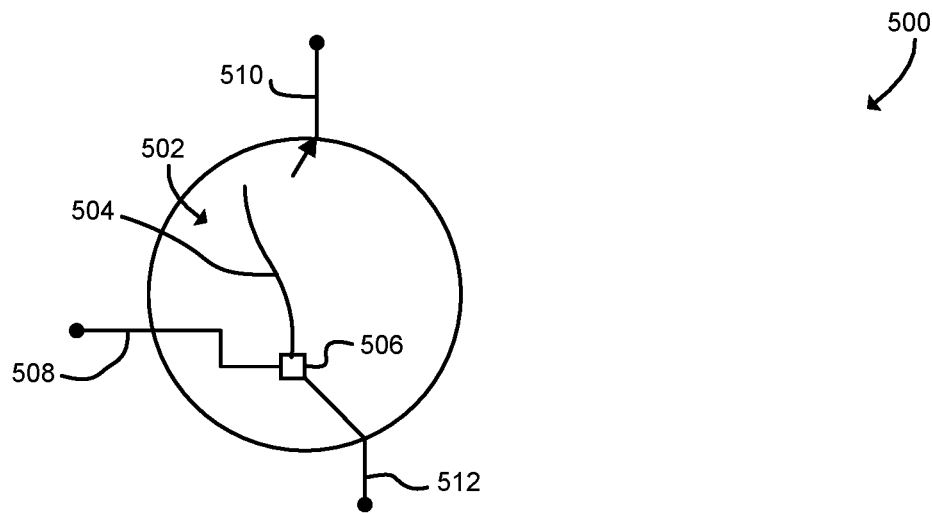
FIGS. 5A and 5B are simplified block diagrams of at least one embodiment of a transistor including a composable piezoelectric actuator of FIGS. 1A-1C.
Figure 5B:
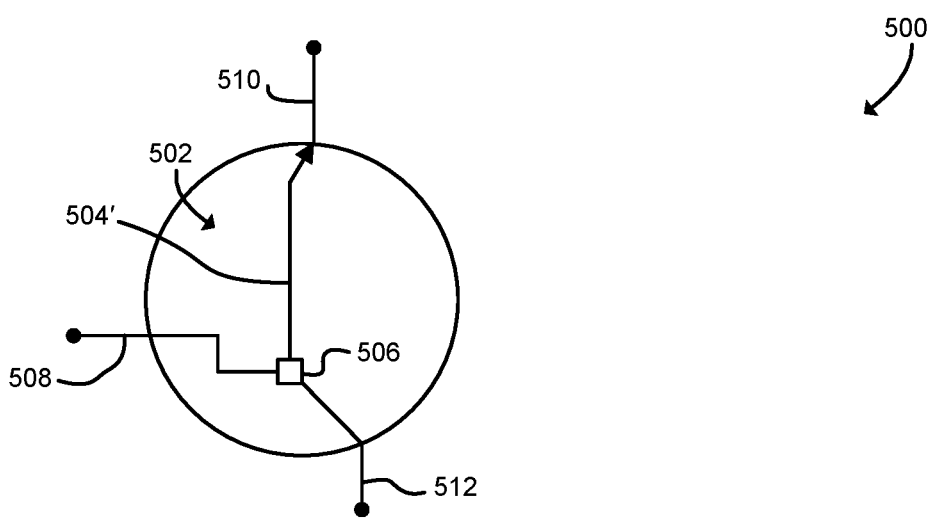

Referring now to FIGS. 5A and 5B, a MEMS 500 includes a piezoelectric actuator 502 having an elongated rod 504 that extends from an anchor 506. The actuator 502 may be embodied as one or more actuators 100 as shown in FIGS. 1A-1C and as described above. The MEMS 500 further includes three electrical terminals 508, 510, 512. The terminals 508, 512 are coupled to the anchor 506, for example to the electrode 106 of the actuator 502. The terminal 510 may be selectively coupled to the rod 504 (and thus to the electrode 106 of the actuator 502) as described further below.

In use, the MEMS 500 may operate similarly to a transistor. Initially, as shown in FIG. 5A, the end of the rod 504 is positioned apart from the terminal 510. The rod 504 may be manufactured with a curved shape as shown in FIG. 5A such that when no electric field is applied to the rod 504, the end of the rod 504 is spaced apart from the terminal 510. Therefore, when in the initial position shown in FIG. 5A, the electrode 106 of the rod 504 is not electrically coupled to the terminal 510 and no electric current may flow between the terminals 510, 512.

When a voltage is applied between the terminal 508 and the electrode 110 of the actuator 502, the rod 504' of the actuator 502 moves to a displaced position as shown in FIG. 5B. The voltage applied between the terminal 508 and the electrode 110 must be above a certain threshold voltage in order for the end of the rod 504 to be displaced enough to contact the terminal 510. In the displaced position shown in FIG. 5B, the rod 504' has moved to a displaced position in which the end of the rod 504' contacts the terminal 510. When in contact with the terminal 510, the electrode 106 of the actuator 502 is electrically connected to both the terminal 510 and the terminal 512. Thus, an electrical current may flow between the terminals 510, 512. When a voltage is no longer applied across the terminal 508 and the electrode 110, the actuator 502 returns to its initial shape as shown in FIG. 5A, breaking contact with the terminal 510 and preventing current flow between the terminals 510, 512. Thus, the MEMS 500 may operate similarly to a transistor. The terminal 508 is similar to a base or gate of a transistor, and the terminals 510, 512 are similar to the collector and emitter or source and drain of a transistor.

Referring now to FIGS. 6A-6D, a MEMS 600 includes three pairs 602, 604, 606 of composable piezoelectric actuators. Each of those actuators may be embodied as one or more actuators 100 as shown in FIGS. 1A-1C and as described above. The pairs 602, 604, 606 of actuators each form a cantilever of mechanically but not electrically connected actuators. In particular, the pair 602 includes actuators 608, 610 that are mechanically coupled together to form a cantilever but are not electrically connected (e.g., the electrodes 106, 110 of each actuator 608, 610 are not electrically connected). Similarly, the pair 604 includes actuators 612, 614 and the pair 606 includes actuators 616, 618. Each actuator is coupled to an input terminal that controls actuation of the corresponding actuator. Illustratively, the actuator 608 is coupled to input terminal 620, the actuator 610 is coupled to input terminal 622, the actuator 612 is coupled to input terminal 624, the actuator 614 is coupled to input terminal 626, the actuator 616 is coupled to input terminal 628, and the actuator 618 is coupled to the input terminal 630. In some embodiments, each of the input terminals 620 to 630 may be coupled to an electrode 106 of the corresponding actuator, and the electrodes 110 of each actuator may be grounded.

The pairs 602, 604, 606 of actuators each further include an independent electrode that is not electrically connected to the associated actuators. In particular, the pair 602 includes an electrode 632, the pair 604 includes an electrode 636, and the pair 606 includes an electrode 634. As described further below, the electrodes 632, 634 may be coupled to logic high and/or logic low voltages, and the electrode 636 is coupled to an output terminal.

In use, the MEMS 600 may operate as a universal logical gate. The particular logical operation may depend on connections made to the various terminals of the MEMs 600. In some embodiments, the input terminals 620 through 630 may be selectively connected to various logical input signals. The terminals 632, 634 may be selectively connected to logic high or logic low values (e.g., $V_{DD}$, ground, or other signal). The terminal 636 provides an output voltage representing the output of the logical operation.

Figure 6A:
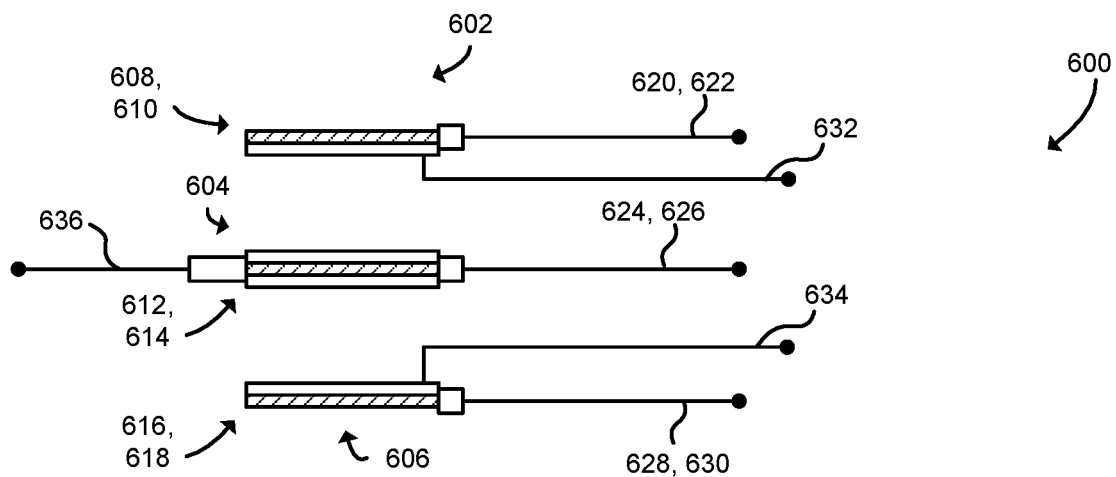
FIGS. 6A-6D are simplified block diagrams of at least one embodiment of a universal logic gate including several of the composable piezoelectric actuators of FIGS. 1A-1C.
Figure 6B:
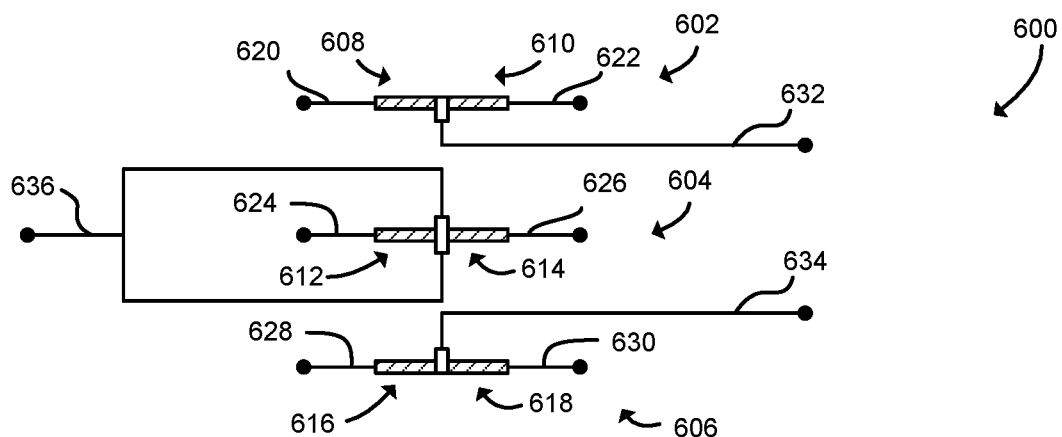

Various combinations of inputs cause the MEMS 600 to move between different positions as shown in FIGS. 6A-6D. In FIGS. 6A and 6B, the actuators 608 through 618 extend straight. For example, no electric field may exist in the actuators, or each pair of actuators may have opposing electric fields. In the position shown in FIGS. 6A and B, the output electrode 636 does not contact either of the electrodes 632, 634. Thus, FIGS. 6A and 6B may show a logic gate in a tristate or disabled state.

Figure 6C:
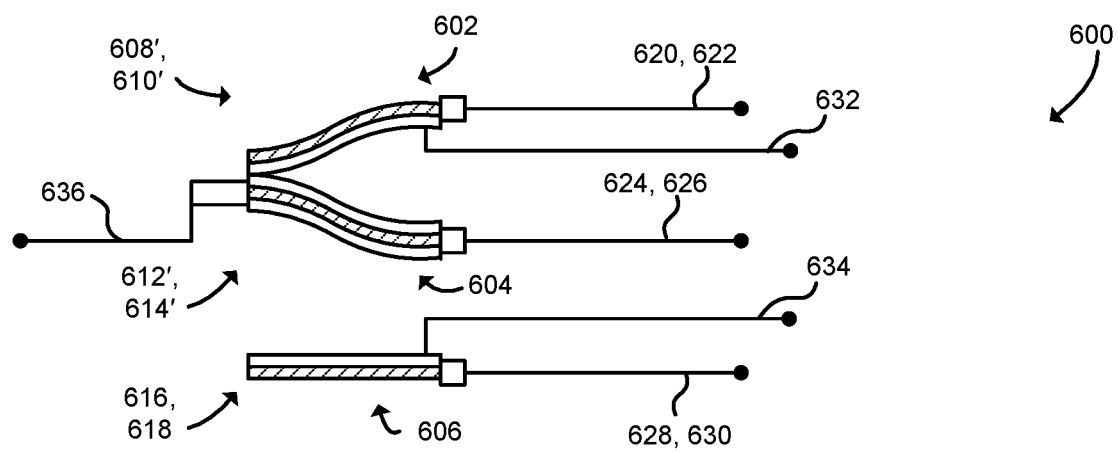
Figure 6D:
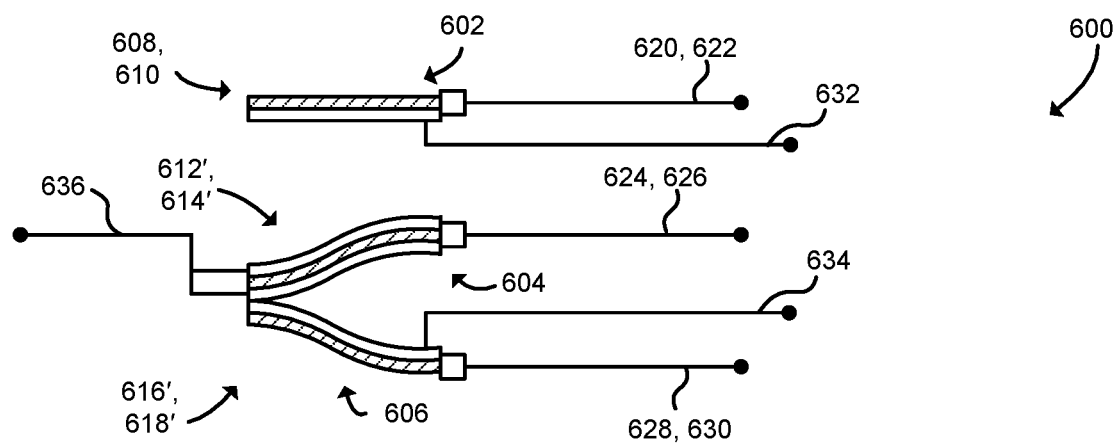

As shown in FIG. 6C, certain combinations of input signals may cause the pairs 602, 604 of actuators to move toward each other. As shown in FIG. 6C, the output electrode 636 is electrically connected to the electrode 632. Thus the logic level signal connected to the electrode 632 (e.g., logic high or logic low) is passed to the output terminal 636. As shown in FIG. 6D, other combinations of input signals may cause the pairs 604, 606 of actuators to move toward each other. As shown in FIG. 6D, the output electrode 636 is electrically connected to the electrode 634. Thus the logic level signal connected to the electrode 634 (e.g., logic high or low) is passed to the output terminal 636. By adjusting the connections made to each of the terminals 620 through 634, the MEMS 600 may generate outputs associated with any of the 10 fundamental logic gates (i.e., BUF, NOT, AND, NAND, OR, NOR, XOR, XNOR, IMPLY and NIMPLY). In some embodiments, a MEMS such as the bistable switch 400 shown in FIGS. 4A-4C and described above may be used to selectively connect the inputs to the MEMS 600. Accordingly, the MEMS 600 may be a dynamically programmable universal logic gate. Accordingly, multiple MEMS 600 connected together may be used similarly to a field-programmable gate array (FPGA) in order to create dynamically programmable digital logic hardware.

Figure 7:
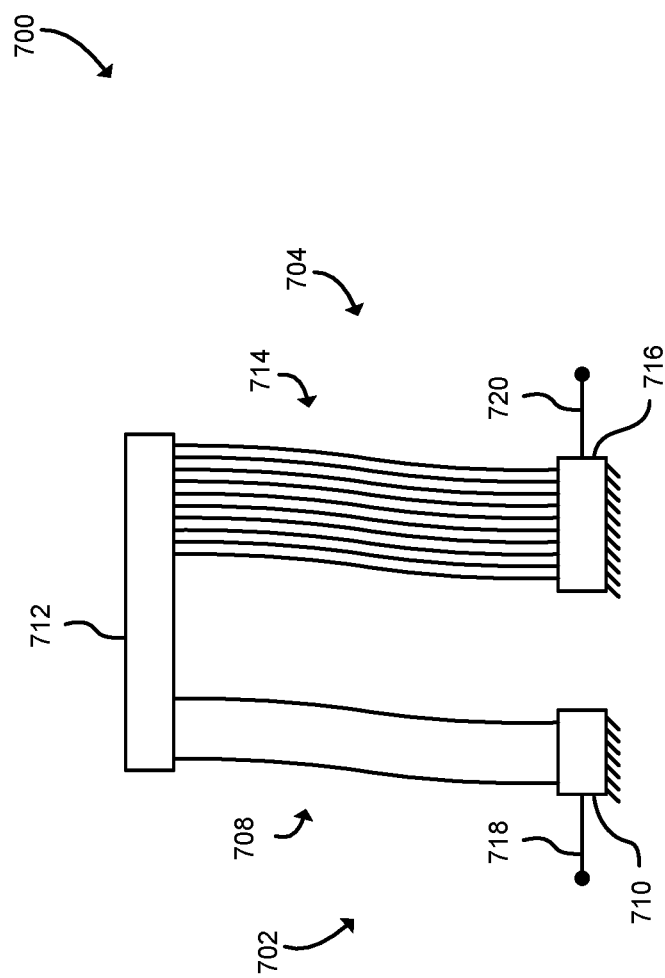
FIG. 7 is a simplified block diagram of at least one embodiment of a transformer/inductor including several of the composable piezoelectric actuators of FIGS. 1A-1C.

Referring now to FIG. 7, a MEMS 700 includes a primary set of composable piezoelectric actuators 702 and a secondary set of composable piezoelectric actuators 704. Each of the actuators 702, 704 may be embodied as one or more actuators 100 as shown in FIGS. 1A-1C and as described above. As shown, the primary set of actuators 702 includes multiple elongated rods 708 connected in parallel that extend from an anchor 710 to an anchor 712. The anchor 710 is fixed in position, and the anchor 712 is free to move as the ends of the rods 708 are displaced.

Similarly, the secondary actuator 704 includes multiple elongated rods 714 connected in parallel. The rods 714 extend from an anchor 716, which is fixed in position to the anchor 712, which is free to move. At the anchor 712, the primary actuators 702 and the secondary actuators 704 are connected mechanically but not electrically. For example, the anchor 712 may be formed from a non-conductive piezoelectric polymer, and the respective electrodes 106, 110 of the primary actuators 702 and the secondary actuators 704 may not contact each other on the anchor 712.

The MEMS 700 further includes electrical terminals 718, 720. The terminal 718 is coupled to the primary actuators 702 (e.g., to a common electrode 106 of the primary actuators 702) and the terminal 720 is coupled to the secondary actuators 704 (e.g., to a common electrode 106 of the secondary actuators 704).

In use, the MEMS 700 may operate as a transformer and/or an inductor. A voltage signal applied to the terminal 718 causes the primary actuator 702 to actuate, moving the anchor 712. The movement of the actuator 702 causes a voltage to be output at the terminal 720 due to the piezoelectric effect. The relationship of input voltage at the terminal 718 ($V_{in}$) to output voltage at the terminal 720 ($V_{out}$) is shown below in Equation 2, and the relationship of input current at the terminal 718 ($I_{in}$) to output current at the terminal 720 ($I_{out}$) is shown below in Equation 3. The constant β depends on the number and/or arrangement of the primary actuators 702 and the secondary actuators 704. Thus, the constant β is similar to the ratio of turns in a conventional, purely electrical transformer. In addition to operating similarly to a transformer, the MEMS 700 may operate as an inductor. In particular, the moving anchor 712 may move and/or vibrate, and inertia associated with the moving mass of the anchor 712 may store kinetic energy, similar to the magnetic energy stored by a conventional electronic inductor. In contrast with a conventional inductor, the MEMS 700 may be capable of having a much higher inductance (measured in H), and the inductance of the MEMS 700 may be easily tuned by adjusting the mass of the anchor 712.

$$V_{out} = -\beta V_{in} \quad (2)$$

$$I_{out} = -\beta I_{in} \quad (3)$$

Figure 8A:
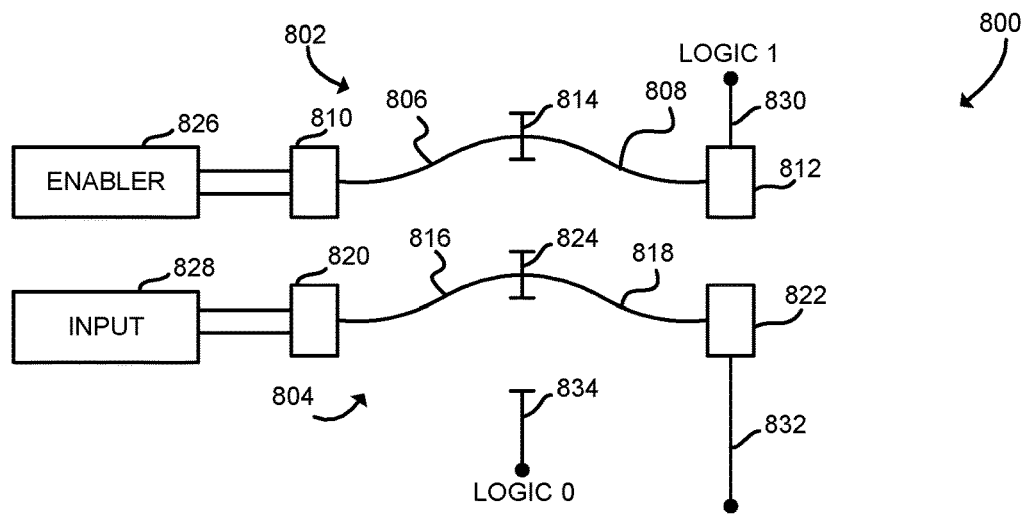
FIGS. 8A-8C are simplified block diagrams of at least one embodiment of a memory device including several of the composable piezoelectric actuators of FIGS. 1A-1C.
Figure 8B:
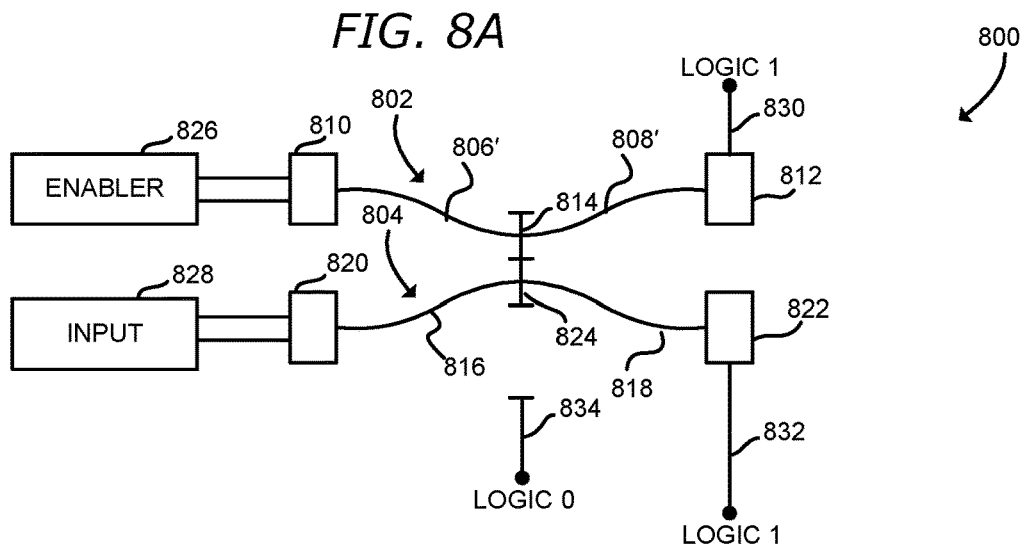
Figure 8C:
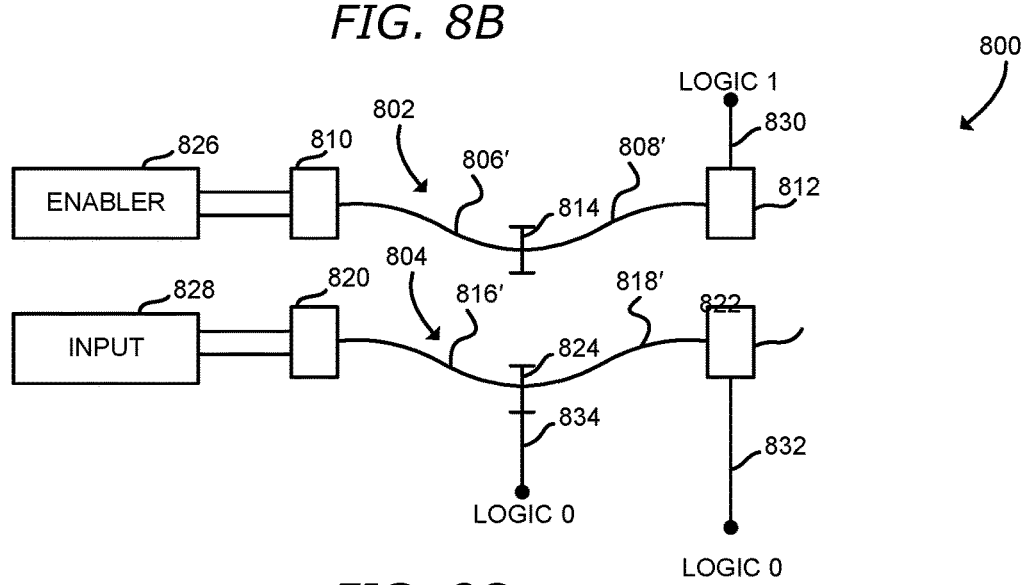

Referring now to FIGS. 8A-8C, a MEMS 800 is structurally similar to the MEMS 400 shown in FIGS. 4A-4C and described above. Similar to the MEMS 400, the MEMS 800 includes a pair of composable piezoelectric actuators 802, 804. Each of the actuators 802, 804 may be embodied as one or more actuators 100 as shown in FIGS. 1A-1C and as described above. As shown, the actuator 802 includes a pair of elongated rods 806, 808 that extend between a pair of anchors 810, 812. In particular, the rod 806 extends from the anchor 810, the rod 808 extends from the anchor 812, and the rods 806, 808 are connected together at their ends. Each of the anchors 810, 812 is fixed in place, and an electrical contact 814 is positioned at the connection of the rods 806, 808. The electrical contact 814 is illustratively coupled to the electrode 106 of both of the rods 806, 808. As shown in FIG. 8A, each of the rods 806, 808 is manufactured with a curved shape such that when no electric field is applied to the rods 806, 808, the ends of the rods 806, 808 (and thus the electrical contact 814) are laterally displaced from an imaginary line that extends straight through the anchors 810, 812. Accordingly, because the ends of the rods 806, 808 are displaced from the anchors 810, 812, the total length of the rods 806, 808 is slightly larger than the distance between the anchors 810, 812.

The actuator 804 is similar to the actuator 802 and includes elongated rods 816, 818 that extend between fixed anchors 820, 822 and an electrical contact 824 positioned at the connection of the rods 816, 818. The electrical contact 824 is illustratively coupled to the electrode 106 of both of the rods 816, 818. The rods 816, 818 are similarly manufactured with a curved shape such that when no electric field is applied to the rods 816, 818, the ends of the rods 816, 818 (and thus the electrical contact 824) are laterally displaced from an imaginary line that extends straight through the anchors 820, 822.

The actuator 802 is coupled to enabler circuitry 826, which is configured to selectively apply a voltage across the electrodes 106, 110 of the actuator 802. In particular, the various components of the actuator 802 include a common electrode 106 and a common electrode 110, and the enabler circuitry 826 may be connected to the electrodes 106, 110 at the anchor 410. Similarly, the actuator 804 is coupled to input circuitry 828, which is configured to selectively apply a voltage across the electrodes 106, 110 of the actuator 804. In particular, the various components of the actuator 804 include a common electrode 106 and a common electrode 110, and the input circuitry 828 may be connected to the electrodes 106, 110 at the anchor 810.

The MEMS 800 further includes an electrical terminal 830 that is coupled to the electrode 106 of the actuator 802 at the anchor 812 and an electrical terminal 832 that is coupled to the electrode 806 of the actuator 804 at the anchor 822. The MEMS 800 may also include an additional terminal 834 as described further below.

In use, MEMS 800 may operate as a bit of non-volatile memory or other memory cell. As shown in FIGS. 8A-8C, the terminal 830 is coupled to a logical "1" or "high" signal, and the terminal 834 is coupled to a logical "0" or "low" signal. Those signals may be 5 volts, 0 volts, or any other appropriate voltage. The terminal 832 is an output terminal and may indicate the logical value stored by the MEMS 800 as described below.

Initially, as shown in FIG. 8A, the MEMS 800 is in a disabled state, and the output terminal 832 is not connected to the logical high terminal 830 or the logical low terminal 834. In this disabled state, the output terminal 832 may be in a tristate or otherwise undefined. To enable, the MEMS 800, the enabler circuitry 826 applies a voltage to the actuator 802, which actuates and moves the contact 814 into contact with the contact 824 as shown in FIG. 8B. In the displaced position shown in FIG. 8B, the contact 814 of the actuator 802 touches the contact 824 of the actuator 804. As described above, the contacts 814, 824 are electrically connected to the electrodes 106 of the respective actuators 802, 804. Thus, when the contacts 814, 824 are touching, the electrodes 106 of the actuators 802, 804 are electrically connected. Accordingly, the logical "1" input at the terminal 830 is connected to the output terminal 832. To change the value on the output terminal 832, the input circuitry 828 applies a voltage to the actuator 804. The actuator 804 may actuate and move the contact 824 into contact with the terminal 834 as shown in FIG. 8C. When the contact 824 touches the terminal 834, the logical "0" input at the terminal 834 is connected to the output terminal 832. The input 828 may apply a reverse voltage to the actuator 804 in order to change the output terminal 832 back to a logical "1" value as shown in FIG. 8B.

As described above, the combined lengths of the rods 806, 808 is greater than the distance between the anchors 810, 812, and the combined lengths of the rods 816, 818 is greater than the distance between the anchors 820, 822. Thus, the actuators 802, 804 are mechanically latched in the positions shown in FIGS. 8A-8C. Accordingly, the MEMS 800 may remain in the corresponding positions shown in FIGS. 8B and 8C without applying additional voltage and/or current. Thus, the MEMS 800 may be used as a non-volatile memory bit or other memory cell that retains its current state (i.e., whether logical 1 or logical 0 is connected to the output terminal 832) without requiring any external voltage or current to refresh the state of the memory. Therefore, the MEMS 800 may provide non-volatile memory with reduced power consumption and/or increased efficiency as compared to other memory technologies.

Figure 9A:
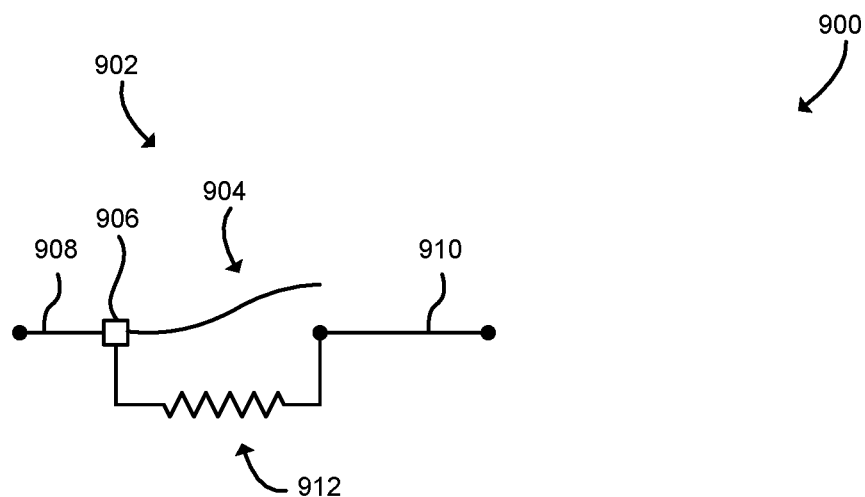
FIGS. 9A and 9B are simplified block diagrams of at least one embodiment of a diode including a composable piezoelectric actuator of FIGS. 1A-1C.
Figure 9B:
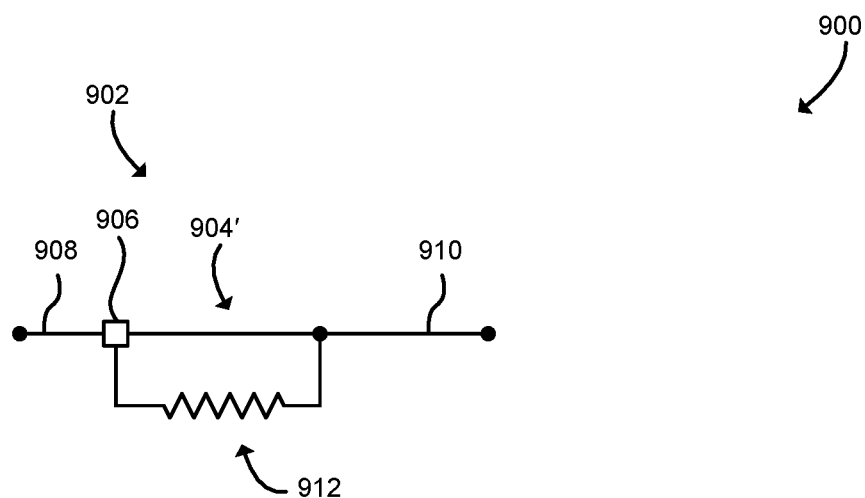

Referring now to FIGS. 9A and 9B, a MEMS 900 includes a piezoelectric actuator 902 having an elongated rod 904 that extends from an anchor 906. The actuator 902 may be embodied as one or more actuators 100 as shown in FIGS. 1A-1C and as described above. The MEMS 900 further includes two electrical terminals 908, 910. The terminal 908 is electrically coupled to the electrode 106 of the actuator 902. The terminal 910 is electrically coupled to the electrode 110 of the actuator 902. Additionally, the terminal 910 may be selectively coupled to the rod 904 (and thus to the electrode 106 of the actuator 902) as described further below. A resistor 912 is electrically connected across both of the terminals 908, 910.

In use, the MEMS 900 may operate similarly to a diode. Initially, as shown in FIG. 9A, the end of the rod 904 is positioned apart from the terminal 910. Illustratively, the rod 904 is manufactured with a curved shape such that when no electric field is applied to the rod 904, the end of the rod 904 is spaced apart from the terminal 910. Thus, when in the position shown in FIG. 9A, electrical current may only flow between the terminals 908, 910 through the resistor 912. As a voltage is applied across the terminals 908, 910, a voltage drop is created across the resistor 912. The resistor 912 may have a large resistance (e.g., millions of ohms) and, thus, for most applications only a small amount of current may flow through the resistor 912. The voltage drop across the resistor 912 creates an electric field across the electrodes 106, 110 of the actuator 902, which causes the actuator 902 to actuate and move an end toward the terminal 910. Illustratively, the actuator 902 is configured so that a positive voltage applied across the electrodes 106, 110 causes the rod 904 to move toward the terminal 910. Additionally or alternatively, in some embodiments, the anchor 902 may be configured such that negative voltage across the electrodes 106, 110 causes the rod 904 to move toward the terminal 910.

When a certain voltage threshold is exceeded, the rod 904 is displaced enough to contact the terminal 910 as shown in FIG. 9B. In the displaced position shown in FIG. 9B, the rod 904' has moved to a displaced position in which the end of the rod 904' contacts the terminal 910. When in contact with the terminal 910, the electrode 106 of the actuator 902 is electrically connected to both the terminals 908, 910. The electrode 106 has lower resistance than the resistor 912; thus, when the actuator 902 is in contact with the terminal 910, a large amount of current may flow between the terminals 908, 910. When a reverse voltage (e.g., a negative voltage for the illustrative example) is applied across the terminals 908, 910, the actuator 902 moves away from the terminal 910 toward the position shown in FIG. 9A, and the electrode 106 breaks contact with the terminal 910. Thus, when a reverse voltage is applied, current can only flow through the resistor 912, which may have a high resistance as described above. Therefore, the MEMS 900 may operate similarly to a diode and allow a large amount of current to flow in one direction and allow only a small amount of leakage current to flow in the other direction.

The various MEMS disclosed herein may be manufactured using any suitable technique. In some embodiments, lithographic techniques may be used to pattern, etch, grow layers, etc., to form the MEMS. For example, the MEMS may be formed beginning with a layer of silicon dioxide on a silicon substrate. The bottom electrode may be patterned onto the silicon dioxide using standard techniques of applying a photoresist, patterning the electrode with a mask, etching the electrode, and removing the photoresist. Then a layer of PVDF may be spun on top of the bottom electrode. The top electrode may then be patterned onto the PVDF in a similar manner as the bottom electrode. The PVDF may then be formed into the desired pattern using an oxygen plasma etch, and the silicon and silicon dioxide can be removed, such as through another etch. The PVDF may then be polarized in the desired direction.

As another example, the MEMS may be formed beginning with a sheet of PVDF. The PVDF may be mounted on a substrate that already has one electrode patterned onto it. The top electrode can then be patterned onto the PVDF, and a fluoride plasma or laser ablation may be used to etch the layers.

As another example, the MEMS may be formed by depositing a layer of lead, such as on top of a bottom electrode that has already been patterned. A layer of PZT may be grown on top of the layer of lead, then the top electrode can be grown on top of the layer of PZT. Portions of the PZT can then be removed using etching.

It should be appreciated that additional or different techniques may be used to form the MEMS described herein. For example, in some embodiments, some or all of the MEMS may be formed using 3D printing.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present disclosure.

The invention claimed is:

1. A microelectromechanical system (MEMS) system, the system comprising:
    a composable piezoelectric actuator comprising an elongated rod coupled to a first electrode and a second electrode, wherein the elongated rod is piezoelectric, and wherein the first electrode and the second electrode are configured such that in response to a voltage applied across the first electrode and the second electrode, an end of the actuator moves from an initial position to a displaced position;
    a first terminal electrically coupled to the first electrode of the actuator;
    a second terminal electrically coupled to the second electrode of the actuator; and
    a resistive element electrically coupled between the first terminal and the second terminal;
    wherein in response to a voltage applied across the resistive element, the actuator moves from the initial position in which the end of the actuator is spaced apart from the second terminal to the displaced position in which the end of the actuator contacts the second terminal, and wherein when the actuator is in the displaced position the first terminal, the first electrode, and the second terminal are electrically connected.

2. A microelectromechanical system (MEMS) system, the system comprising:
    a composable piezoelectric actuator comprising an elongated rod coupled to a first electrode and a second electrode, wherein the elongated rod is piezoelectric, and wherein the first electrode and the second electrode are configured such that in response to a voltage applied across the first electrode and the second electrode, an end of the actuator moves from an initial position to a displaced position;
a first terminal electrically coupled to the first electrode of the actuator;
a second terminal electrically coupled to the first electrode of the actuator; and
a third terminal;
wherein in response to a voltage applied across the first terminal and the second electrode, the actuator moves from the initial position in which the end of the actuator is spaced apart from the third terminal to the displaced position in which the end of the actuator contacts the third terminal, and wherein when the actuator is in the displaced position, the second terminal, the first electrode, and the third terminal are electrically connected.

3. A microelectromechanical system (MEMS) system, the system comprising:
a composable piezoelectric actuator comprising an elongated rod coupled to a first electrode and a second electrode, wherein the elongated rod is piezoelectric, and wherein the first electrode and the second electrode are configured such that in response to a voltage applied across the first electrode and the second electrode, an end of the actuator moves from an initial position to a displaced position;
a first terminal electrically coupled to the first electrode of the actuator; and
a power choking device coupled to the first terminal;
wherein in response to releasing power with the power choking device, the end of the actuator moves from the displaced position to the initial position.

4. A microelectromechanical system (MEMS) system, the system comprising:
a first anchor and a second anchor, wherein a first imaginary line extends through the first anchor and the second anchor;
a composable piezoelectric actuator comprising an elongated piezoelectric rod coupled to a first electrode and a second electrode, wherein the first electrode and the second electrode are configured such that in response to a voltage applied across the first electrode and the second electrode, an end of the actuator moves from an initial position to a displaced position;
a second composable piezoelectric actuator comprising an elongated piezoelectric rod coupled to a first electrode and a second electrode, wherein the first electrode and the second electrode are configured such that in response to a voltage applied across the first electrode and the second electrode, an end of the second actuator moves from an initial position to a displaced position; and
a first terminal electrically coupled to the first electrode of the actuator;
wherein the composable piezoelectric actuator is coupled to the first anchor and extends toward the second anchor, the second composable piezoelectric actuator is coupled to the second anchor and extends toward the first anchor, and the end of the composable piezoelectric actuator is coupled to the end of the second composable piezoelectric actuator;
wherein in the initial position the ends of the composable piezoelectric actuator and the second composable piezoelectric actuator are positioned on a first side of the first imaginary line, and wherein in the displaced position the ends of the composable piezoelectric actuator and the second composable piezoelectric actuator are positioned on a second side of the first imaginary line; and
wherein the composable piezoelectric actuator and the second composable piezoelectric actuator comprise a first pair of actuators, the system further comprising:
a first electrical contact positioned between the first pair of actuators;
a second pair of actuators coupled between a third anchor and a fourth anchor, wherein a second electrical contact is positioned between the second pair of actuators, wherein the first electrode and the second electrode are configured such that in response to a voltage applied across the first electrode and the second electrode, an end of each actuator moves from an initial position to a displaced position, wherein in an initial position, the second electrical contact is positioned on a first side of an imaginary line extending through the third anchor and the fourth anchor and in the displaced position the second electrical contact is positioned on a second side of the imaginary line extending through the third anchor and the fourth anchor; and
a second terminal coupled to the first electrode of the second pair of actuators;
wherein when the second pair of actuators is in the displaced position, the second electrical contact contacts a third terminal;
wherein when the first pair of actuators is in the initial position, the first electrical contact does not contact the second electrical contact;
wherein when the first pair of actuators is in the displaced position and the second pair of actuators is in the initial position, the first electrical contact contacts the second electrical contact; and
wherein when the first pair of actuators is in the displaced position and the second pair of actuators is in the displaced position, the first electrical contact does not contact the second electrical contact.

5. The system of claim 4, wherein:
the first terminal is coupled to a system input;
the second terminal is coupled to a system output; and
the third terminal is coupled to a system ground.

6. The system of claim 4, wherein:
the first terminal is coupled to a logic high signal;
the second terminal is coupled to a system output; and
the third terminal is coupled to a logic low signal.

7. A microelectromechanical system (MEMS), the system comprising:
a first set of actuators, each actuator comprising a composable piezoelectric actuator including an elongated piezoelectric rod coupled to a first electrode and a second electrode, wherein the first electrode and the second electrode are configured such that in response to a voltage applied across the first electrode and the second electrode, an end of the actuator moves from an initial position to a displaced position, and wherein the first set of actuators extends from a first anchor to a second anchor, wherein the first anchor is fixed and the second anchor is free;
a second set of actuators that extend from a third anchor to the second anchor, each actuator comprising a composable piezoelectric actuator, wherein the third anchor is fixed, wherein the first set of actuators is mechanically coupled to the second set of actuators at the second anchor, and wherein the first set of actuators is electrically isolated from the second set of actuators;

a first terminal electrically coupled to the first set of actuators; and a second terminal electrically coupled to the second set of actuators.

8. The system of claim 7, wherein:

in response to a first voltage applied to the first terminal, the first set of actuators moves to the displaced position and urges the second set of the actuators to move to the displaced position; and in response to movement to the displaced position, the second set of actuators generates a second voltage at the second terminal.

9. The system of claim 7, wherein the first set of actuators includes a first number of actuators, and the second set of actuators includes the first number of actuators.

10. The system of claim 7, wherein the first set of actuators includes a first number of actuators, and the second set of actuators includes a second number of actuators greater than the first number.

11. The system of claim 7, wherein the end of each elongated rod of each actuator of the first set of actuators is coupled to the second anchor.

12. The system of claim 11, wherein the end of each elongated rod of each actuator of the second set of actuators is coupled to the second anchor.

13. The system of claim 11, further comprising an intermediate anchor, wherein:

the second set of actuators includes a first subset and a second subset;

the end of each elongated rod of each actuator of the first subset is coupled to the intermediate anchor; and the elongated rod of each actuator of the second subset extends from the intermediate anchor to the second anchor.

\* \* \* \* \*